US008077768B2

(12) United States Patent
Nakano et al.

(10) Patent No.: US 8,077,768 B2
(45) Date of Patent: Dec. 13, 2011

(54) DIGITAL SIGNAL PROCESSING APPARATUS

(75) Inventors: Itsuki Nakano, Atsugi (JP); Akira Ikeuchi, Atsugi (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 823 days.

(21) Appl. No.: 11/705,686

(22) Filed: Feb. 13, 2007

(65) Prior Publication Data
US 2007/0189400 A1      Aug. 16, 2007

(30) Foreign Application Priority Data

Feb. 13, 2006   (JP) .................................. 2006-035593
Jan. 31, 2007   (JP) .................................. 2007-022195

(51) Int. Cl.
*H03K 9/06*     (2006.01)
(52) U.S. Cl. ...................................... 375/239; 375/242
(58) Field of Classification Search .................. 375/239; 327/1, 100; 329/313; 332/112; 370/205, 370/213
See application file for complete search history.

(56) References Cited

U.S. PATENT DOCUMENTS

| | | | | |
|---|---|---|---|---|
| 5,278,487 A * | 1/1994 | Koenck | ................. | 320/132 |
| 5,311,181 A * | 5/1994 | Ferguson et al. | ............ | 341/143 |
| 5,563,496 A * | 10/1996 | McClure | .................... | 320/128 |
| 5,592,094 A * | 1/1997 | Ichikawa | .................... | 324/427 |
| 5,606,242 A * | 2/1997 | Hull et al. | ...................... | 320/106 |
| 5,691,621 A * | 11/1997 | Phuoc et al. | ................... | 320/134 |
| 6,969,973 B2 * | 11/2005 | Ooi et al. | ..................... | 320/132 |
| 7,039,150 B1 * | 5/2006 | Drori | .......................... | 375/377 |
| 2005/0062457 A1 * | 3/2005 | Galant et al. | ................. | 320/128 |
| 2005/0231206 A1 * | 10/2005 | Denning | ..................... | 324/430 |
| 2006/0267552 A1 * | 11/2006 | Baer et al. | .................... | 320/128 |

OTHER PUBLICATIONS

Patent Abstract of Japan 11-264849 Published Sep. 28, 1999.

* cited by examiner

*Primary Examiner* — Shuwang Liu
*Assistant Examiner* — Helene Tayong
(74) *Attorney, Agent, or Firm* — Ladas & Parry LLP (57) ABSTRACT

A digital signal processing apparatus for converting an analog signal to a digital signal and digitally processing the digital signal is disclosed. The apparatus includes a modulation part for performing pulse density modulation on the analog signal and outputting a pulse density modulation signal, a memory for storing a conversion program for converting the pulse density modulation signal to pulse code modulation data, and a CPU for receiving the pulse density modulation signal from the modulation part and converting the received pulse density modulation signal to pulse code modulation data according to the conversion program stored in the memory.

4 Claims, 7 Drawing Sheets

DIGITAL SIGNAL PROCESSING APPARATUS

BACKGROUND OF THE INVENTION

1. Field of the Invention

The present invention generally relates to a digital signal processing apparatus, and more particularly to a digital signal processing apparatus for obtaining analog signals, converting the analog signals to digital signals, and performing a digital process on the digital signals.

2. Description of the Related Art

Along with recent advances in digital signal processing apparatuses (e.g. CPU), various processes are being performed in the field of signal processing by digitizing analog signals.

According to a related art case (see, for example, Japanese Laid-Open Patent Application No. 11-264849), in a process of supplying analog signals to a CPU, the analog signals are to be converted to digital data by using, for example, an analog-to-digital converter before supplying the signals to the CPU.

Accordingly, in a case of performing a digital process on analog signals with such a digital signal processing apparatus, the digital process is to be performed by converting the analog signals to digital data beforehand and supplying the digital data to a CPU. Therefore, such an apparatus requires an analog-to-digital converter having a complicated configuration for performing a digital process on analog signals.

SUMMARY OF THE INVENTION

The present invention may provide digital signal processing apparatus that substantially obviate one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by digital signal processing apparatus particularly pointed out in the specification in such full, clear, concise, and exact terms as to enable a person having ordinary skill in the art to practice the invention.

To achieve these and other advantages and in accordance with the purpose of the invention, as embodied and broadly described herein, an embodiment of the present invention provides a digital signal processing apparatus for converting an analog signal to a digital signal and digitally processing the digital signal, the apparatus including: a modulation part for performing pulse density modulation on the analog signal and outputting a pulse density modulation signal; a memory for storing a conversion program for converting the pulse density modulation signal to the pulse code modulation data; and a CPU for receiving the pulse density modulation signal from the modulation part and converting the received pulse density modulation signal to pulse code modulation data according to the conversion program stored in the memory.

In the digital signal processing apparatus according to an embodiment of the present invention, the CPU may intermittently activate the conversion program, obtain the pulse density modulation signal from the modulation part, and convert the obtained pulse density modulation signal to the pulse code modulation data.

In the digital signal processing apparatus according to an embodiment of the present invention, the digital signal processing apparatus may further include a detection part for detecting the analog signal and supplying the analog signal to the modulation part.

In the digital signal processing apparatus according to an embodiment of the present invention, the digital signal processing apparatus may further include: a battery connected to the detection part; wherein the detection part includes a voltage detection part for detecting voltage of the battery, a current detection part for detecting charge current and discharge current of the battery, a temperature detection part for detecting temperature, and a selection part for selecting an analog signal output from one of the voltage detection part, the current detection part, and the temperature detection part and supplying the selected analog signal to the modulation part.

In the digital signal processing apparatus according to an embodiment of the present invention, the analog signal may indicate the charge current and discharge current of the battery, wherein the memory stores a remaining battery amount calculation program used for calculating the amount of charge remaining in the battery by integrating the charge current and discharge current of the battery, and wherein the CPU calculates the amount of charge remaining in the battery by integrating the pulse code modulation data of the charge current and discharge current of the battery according to the remaining battery amount calculation program stored in the memory.

In the digital signal processing apparatus according to an embodiment of the present invention, the modulation part may be a sigma-delta converter.

In the digital signal processing apparatus according to an embodiment of the present invention, the detection part, the modulation part, the memory, and the CPU may be mounted on the same semiconductor integrated circuit apparatus.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 1:
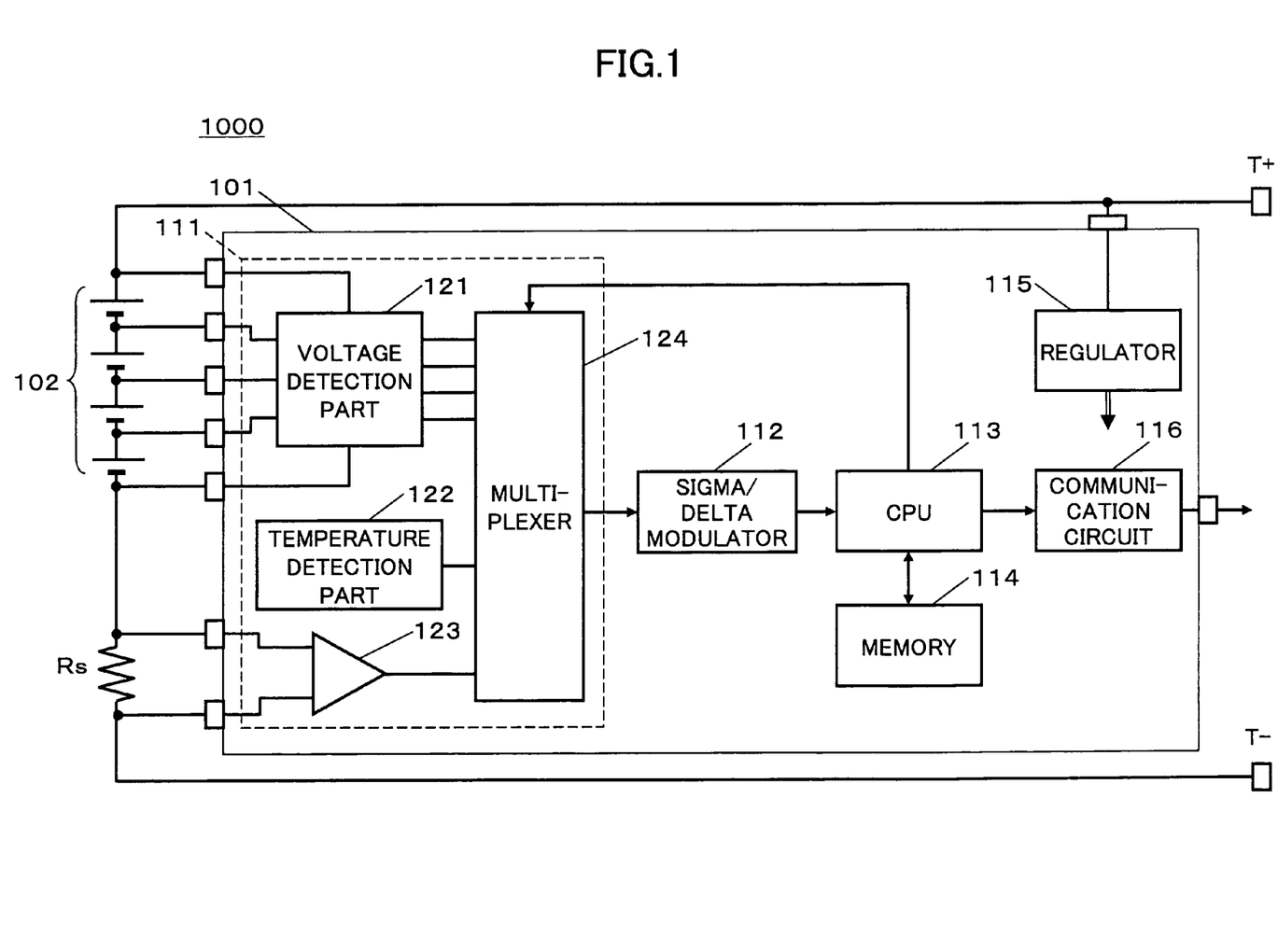
FIG. 1 is a block diagram showing an exemplary configuration of a digital signal processing apparatus according to an embodiment of the present invention.

FIG. 1 is a block diagram showing a digital signal processing apparatus 1000 according to an embodiment of the present invention. In an embodiment of the present invention, the digital signal processing apparatus 1000 is applied to a remaining battery charge amount detection circuit 101.

In FIG. 1, the remaining battery amount detection circuit 101 may be formed, for example, on a single semiconductor board. The remaining battery amount detection circuit 101 includes, for example, a detection part 111, a sigma-delta modulator 112, a CPU 113, a memory 114, a regulator 115, and a communication circuit 116.

The detection part 111 includes, for example, a voltage detection part 121, a temperature detection part 122, a current detection part 123, and a multiplexer 124.

The voltage detection part 121 is connected to both ends of a lithium ion battery 102 (hereinafter referred to as "battery 102") for detecting the voltage of the battery 102. The detection signals detected by the voltage detection part 121 are supplied to the multiplexer 124. The temperature detection part 122, which is for detecting ambient temperature, generates and outputs detection signals corresponding to detected ambient temperature. The detection signals of the temperature detection part 122 are supplied to the multiplexer 124.

The current detection part 123 includes, for example, a differential amplifier. The current detection part 123 is connected to both ends of a current detection resistance Rs connected between the battery 102 and a terminal T−. The current detection part 123 detects voltage generated in the current detection resistance Rs according to current flowing through the current detection resistance Rs and outputs detection signals corresponding to charge and discharge currents of the battery 102.

For example, the detection signals output from the current detection part 123 have a value equal to a reference voltage V0 when there is neither charge current or discharge current flowing in the battery 102, have a value greater than the reference voltage V0 when charge current is flowing in the battery 102, and have a value less than the reference voltage V0 when discharge current is flowing in the battery 102. The detection signals of the current detection part 123 are supplied to the multiplexer 124.

The multiplexer 124 selects the detection signals of the voltage detection part 121, the detection signals of the temperature detection part 122, or the detection signals of the current detection part 123 in accordance with a control signal from the CPU 113 and supplies the selected detection signals to the sigma-delta modulator 112.

The sigma-delta modulator 112 performs PDM (pulse density modulation), that is, 1 bit digital modulation on the analog signals from the multiplexer 124 and supplies the modulated signals to the CPU 113.

The CPU 113 executes a digital filtering process program stored in the memory 114 for converting the PDM signals to digital values of multiple bits. In other words, the CPU 113 converts the PDM signals to PCM (Pulse Code Modulation) data. Furthermore, the CPU 113 executes a remaining battery amount calculation program for calculating the amount of charge remaining in the battery 102. It is to be noted that the CPU 113 according to an embodiment of the present invention includes, for example, a processor such as a microprocessor.

The communication circuit 116 transmits signals indicating the remaining amount of battery calculated by the CPU 113 to an outside circuit. The regulator 115 obtains power supply from the battery 102, generates power supply voltage required in the remaining battery amount circuit 101, and supplies the generated voltages to respective parts of the remaining battery amount circuit 101.

<Configuration of Sigma-Delta Modulator>

Figure 2:
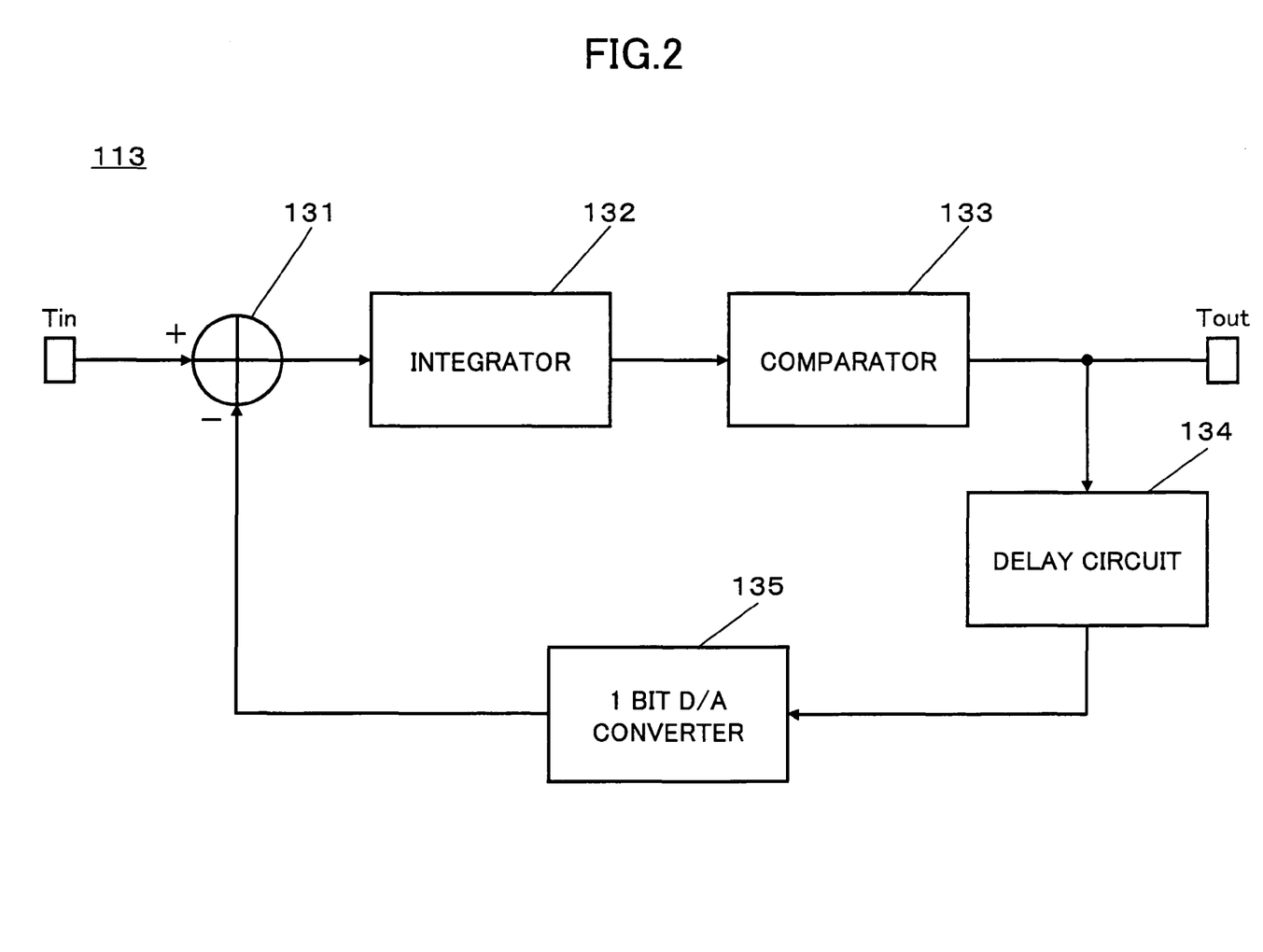
FIG. 2 is a block diagram showing a sigma-delta modulator according to an embodiment of the present invention.

FIG. 2 is a block diagram showing an exemplary configuration of a sigma-delta modulator 112 according to an embodiment of the present invention. In FIG. 2, the sigma-delta modulator 112 includes, for example, a subtractor 131, an integrator 132, a comparator 133, a delay circuit 134, and a 1 bit D/A converter 135.

The subtractor 131 obtains difference by subtracting the output of the D/A converter 135 from an analog signal supplied from the multiplexer 124 via an input terminal Tin and outputs a difference signal according to the obtained difference. The difference signal output from the subtractor 131 is supplied to the integrator 132.

The integrator 132 integrates the difference signal supplied from the subtractor 131 and outputs an integration signals according to the integration. The integration signal output from the integrator 132 is supplied to the comparator 133.

The comparator 133 compares the integration signal supplied from the integrator 132 with a reference voltage V0 set in the comparator 133. The comparator 133 outputs a high level signal when the integration signal (integrated analog signal) is greater than the reference voltage V0 and outputs a low level signal when the integration signal is less than the reference signal.

The output signal of the comparator 133 is output from an output terminal Tout and is also supplied to the delay circuit 134. The delay circuit 134 delays the output signal of the comparator 133 for a period equal to a single sampling period and outputs a delayed signal.

The delayed signal output from the delay circuit 134 is supplied to the 1 bit D/A converter 135. The 1 bit D/A converter 135 performs 1 bit D/A conversion on the delayed signal from the delay circuit 134 and supplies the converted signal to the subtractor 131.

A PDM (Pulse Density Modulation) signal, that is, a 1 bit digital modulated signal obtained by modulating the analog signal from the multiplexer 124 is output from the output terminal Tout of the sigma-delta modulator 112.

The PDM signal output from the output terminal Tout of the sigma-delta modulator 112 is supplied to the CPU 113. Accordingly, the CPU 113 executes a process based on a program stored in the memory 114.

<Data Configuration of Memory>

Figure 3:
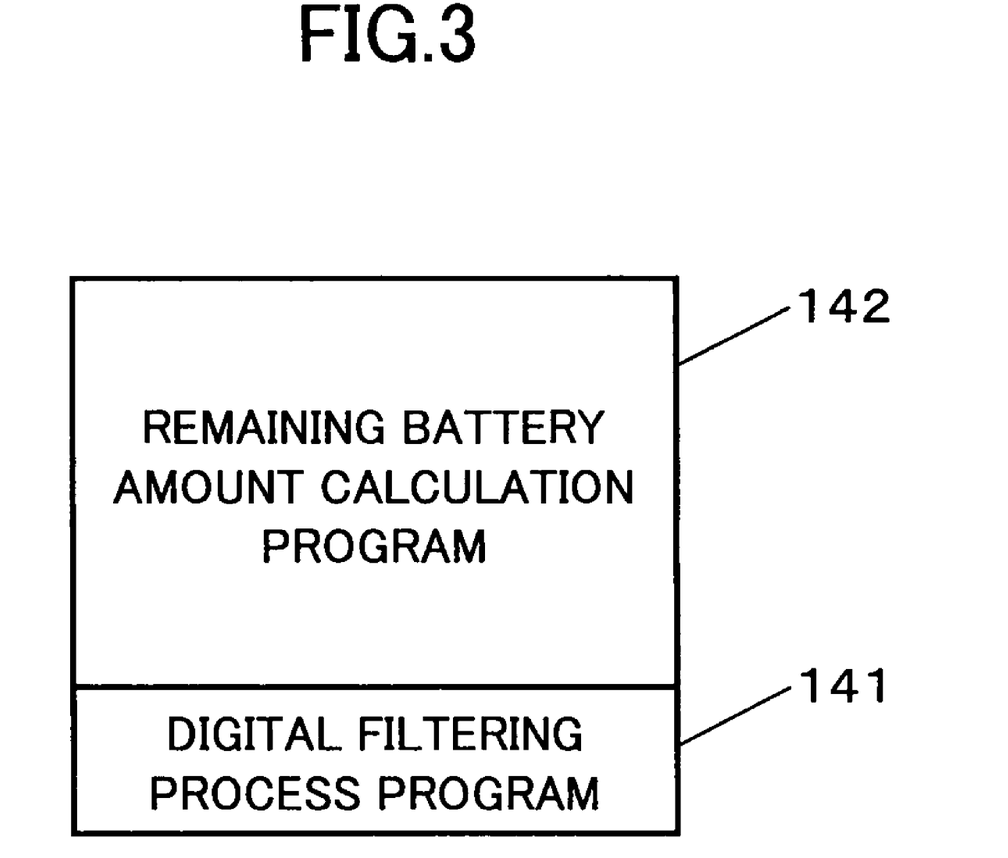
FIG. 3 is a schematic diagram showing a data configuration of a memory according to an embodiment of the present invention.

The memory 114 according to an embodiment of the present invention includes recording media (e.g. a ROM and a RAM) having relatively small memory space of approximately 2K bytes. The ROM stores programs to be executed by the CPU 113. The ROM in the memory 114 stores, for example, a digital filtering process program 141 and a remaining battery amount calculation program 142 as shown in FIG. 3. The RAM is used, for example, as a working space when the CPU 113 executes programs.

For example, the digital filtering process program 141 is for performing a digital filtering process on a PDM signal from the sigma-delta modulator 112, in which the PDM signal from the sigma-delta modulator 112 is converted to a digital value of multiple bits, that is, PCM data. The digital filtering process program 141 includes, for example, a program for executing a decimation filtering process.

The decimation filtering process includes CIC (Cascaded Integrated Combinatorial) filtering process and a FIR (Finite Impulse Response) filtering process. It is to be noted that a IIR (Infinite Impulse Response) filtering process may be used as an alternative of the FIR filtering process.

The remaining battery amount calculation program 142 is for calculating the amount remaining in the battery 102 by integrating the PCM data converted by the digital filtering process program 141. The calculated remaining amount is stored in the memory 114.

<CPU Process>

Figure 4:
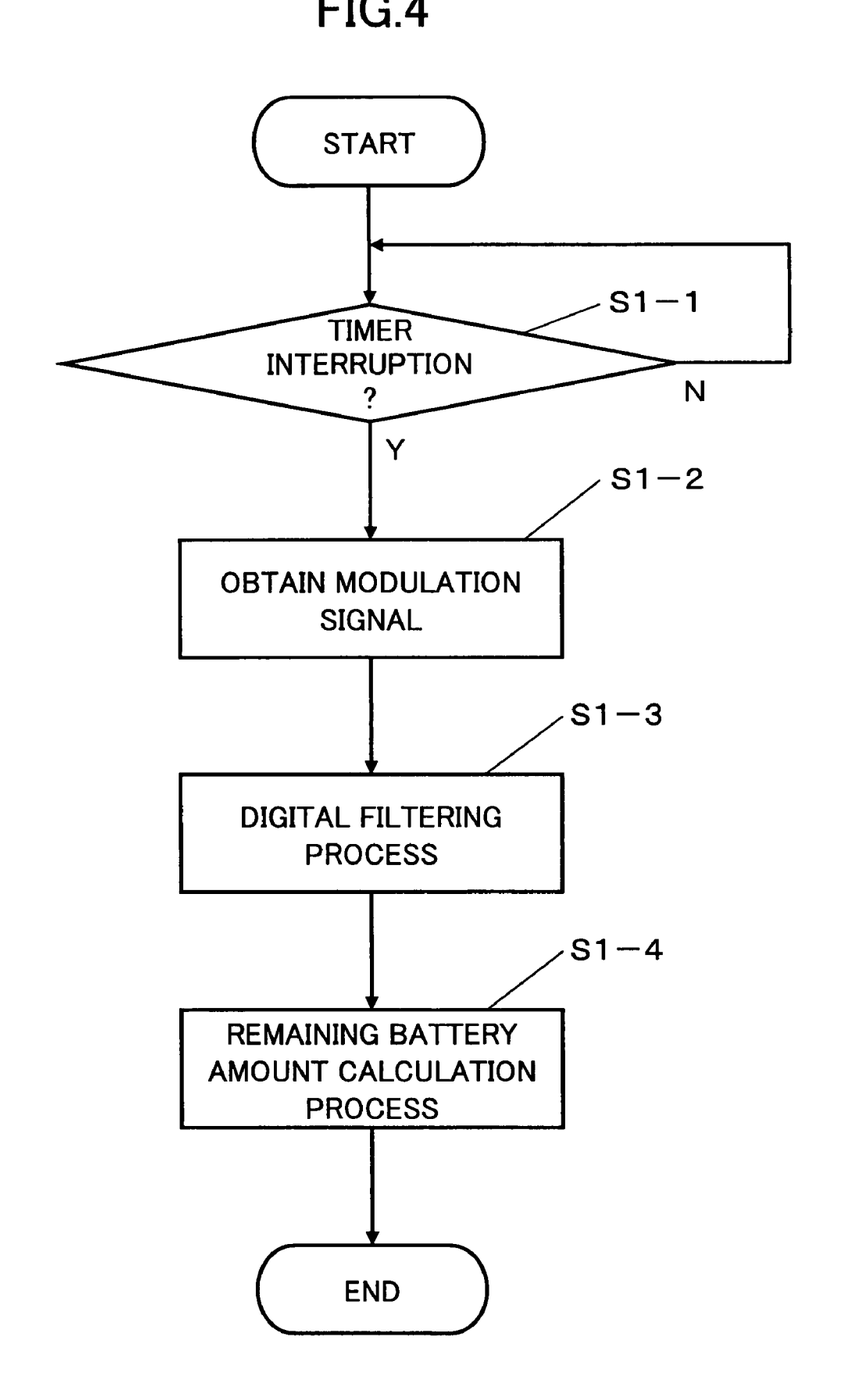
FIG. 4 is a flowchart showing a process executed by a CPU according to an embodiment of the present invention.

Next, a process executed by the CPU 113 is described. FIG. 4 is a flowchart showing a process executed by the CPU 113 according to an embodiment of the present invention. In this example shown in FIG. 4, the CPU 113 intermittently executes a process for reducing the amount of power consumption in accordance with a built-in interruption timer.

Whenever a timer interruption is generated (Yes in Step S1-1), the CPU 113 obtains a PDM signal from the sigma-delta modulator 112. For example, the CPU 113 generates a timer interruption each predetermined interval (e.g. approximately 1 ms) equaling to a PDM signal comprising a bit string of eight bits.

Then, the CPU 113 executes a digital filtering process program 141 with respect to a PDM signal obtained from the sigma-delta modulator 112 (S1-2). Accordingly, the PDM signal obtained from the sigma-delta modulator 112 is converted to a digital value having multiple bits, that is, PCM data.

It is to be noted that the CPU 113 controls the multiplexer 124 so as to sequentially obtain PDM signals corresponding to the analog detection signals output from the voltage detection part 121, the temperature detection part 122, and the current detection part 123 and sequentially convert the PDM signals to PCM data by executing the digital filtering process program 141. Accordingly, the CPU sequentially stores the converted data in the memory 114.

Then, the CPU 113 executes the battery remaining amount calculation program 142 and calculates the amount remaining in the battery 102 based on voltage value, temperature, and current value that are converted to PCM data. For example, the remaining amount of battery can be calculated by integrating the current values. The voltage value and the temperature may be used for correcting the calculated remaining amount.

<Decimation Filtering Process>

Figure 5:
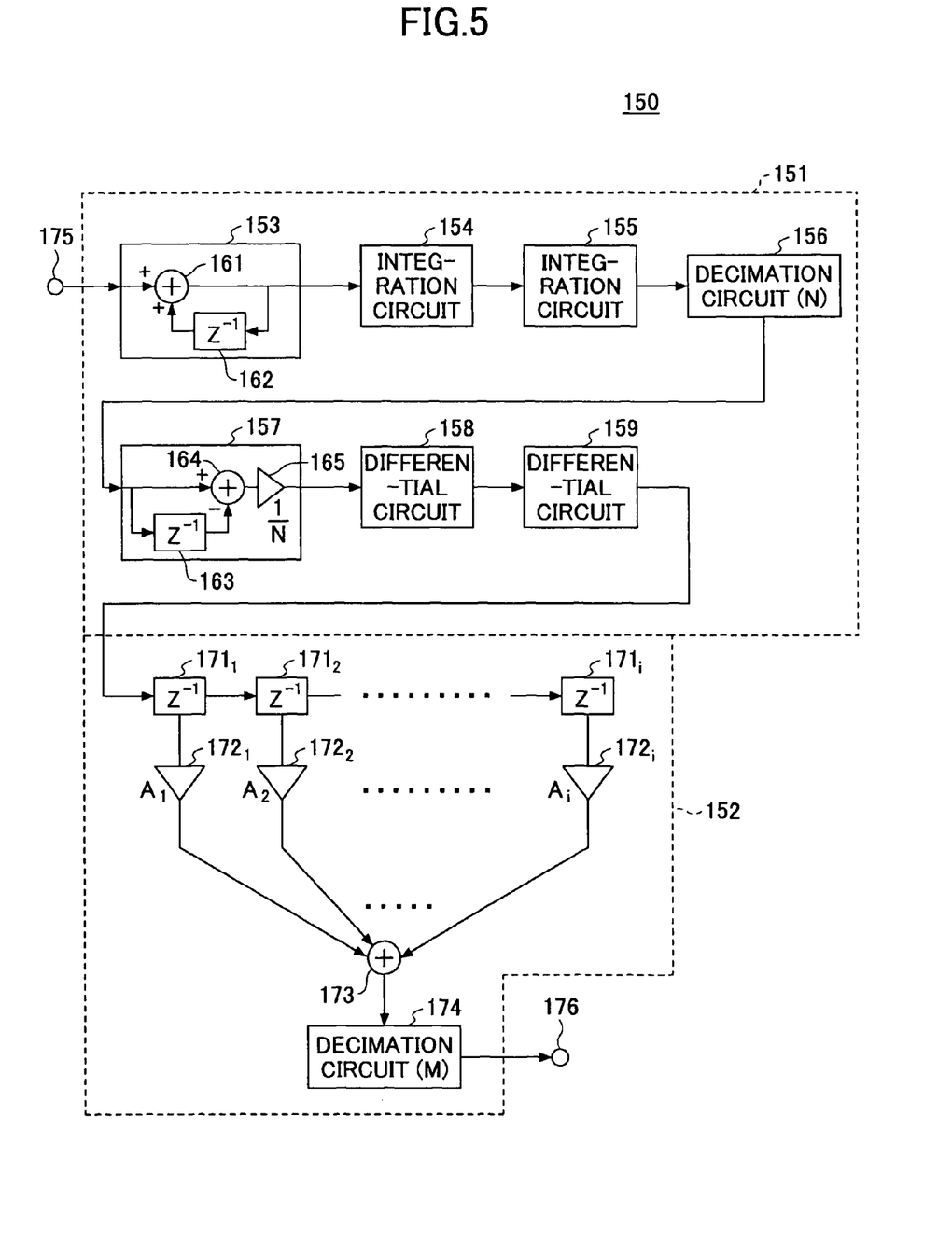
FIG. 5 is a block diagram showing an exemplary hardware configuration of a decimation filter according to an embodiment of the present invention.

Next, a decimation filtering process is described. FIG. 5 is a block diagram showing an exemplary hardware configuration of a decimation filter 150 according to an embodiment of the present invention. The decimation filter 150 includes a CIC (Cascaded Integrated Combinatorial) filter part 151 and a FIR (Finite Impulse Response) filter part 152.

The CIC filter part 151 includes three levels of cascade connected integration circuits 153, 154, and 155, a decimation circuit 156, and three levels of cascade connected differential circuits 157, 158, and 159.

Each of the integration circuits 153-155 includes an adder 161 and a delay device 162. The adder 161 is for adding input data and output data of a delay device 162 and the delay device 162 is for delaying the output data of the adder 161 for a period equal to a single sampling period and supplying the delayed data to the adder 161. Each of the differential circuits includes a delay device 163, a subtractor 164, and a divider 165. The delay device 163 is for delaying input data for a period equal to a single sampling period. The subtractor 164 is for subtracting the output data of the delay device 163 from the input data. The divider 165 is for dividing the output data of the subtractor 164 by N.

The decimation circuit 156 extracts a part of the PCM data output from the integration circuit 155 one time during N sampling periods and supplies the extracted PCM data to the differential circuit 157.

After PDM signals supplied from a terminal 175 are integrated in the integration circuits 153-155 and converted to PCM data, the decimation circuit 156 performs decimation of N:1 on the PCM data. Then, the PCM data are differentiated in the differential circuits 157-159 and output as PCM data.

The FIR filter part 152 includes i levels of cascade connected delay devices $171_1$-$171_i$, multipliers $172_1$-$172_i$ for multiplying coefficients $A_1$-$A_i$ to the PCM data output from the corresponding delay devices $172_1$-$172_i$, an adder 173 for adding data output from each of the multilpliers $172_1$-$172_i$, and a decimation circuit 174.

The PCM data output from the differential circuit 159 are sequentially delayed in the delay devices $171_1$-$171_i$ and multiplied with coefficients $A_1$-$A_i$ in the multipliers $172_1$-$172_i$, respectively, then the adder 173 adds the total data output from the multipliers $172_1$-$172_i$. Then, the decimation circuit 174 extracts a part of the PCM data output from the adder 173 one time during M sampling periods (decimation of M:1) and outputs the extracted PCM data to a terminal 176. Thereby, the digital filtering process is completed.

The digital filtering process program 141 executed by the CPU 113 is achieved by using software to perform the same process executed by the decimation filter having the hardware configuration shown in FIG. 5.

Figure 6:
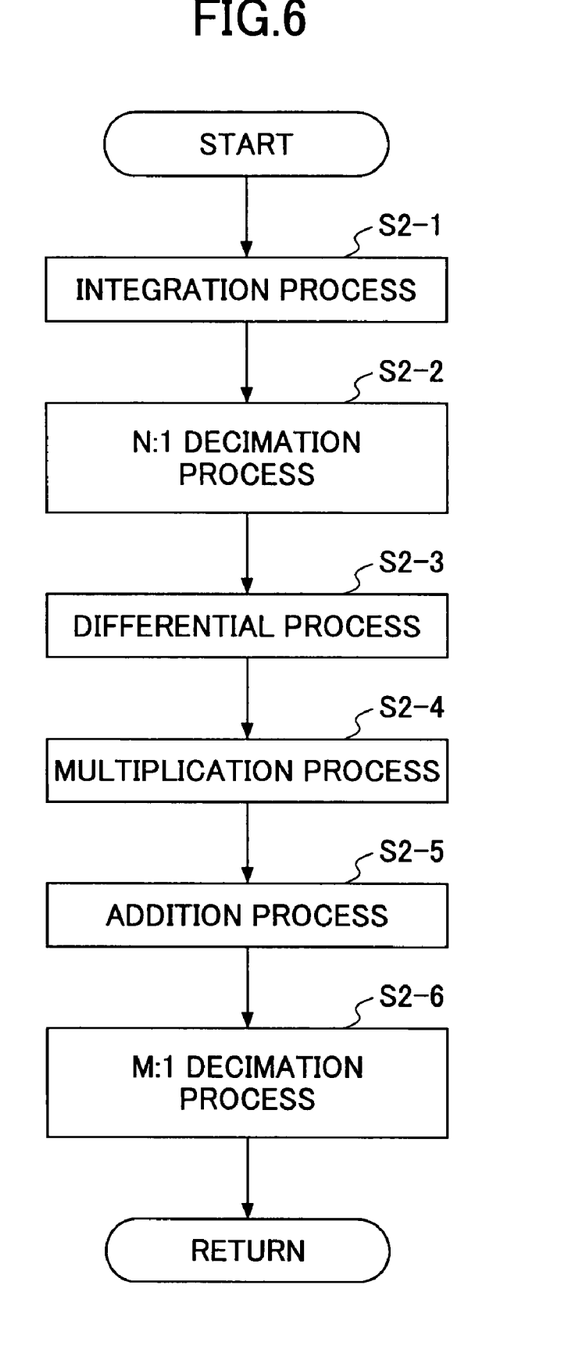
FIG. 6 is a detail flowchart showing a digital filtering process of Step S1-2 of FIG. 4 according to an embodiment of the present invention.

FIG. 6 is a flowchart showing, in more detail, a digital filtering process executed by the CPU 113 in Step S1-3 of FIG. 4. In FIG. 6, the CPU 113 reads out a PDM signal comprising a bit string of eight bits from the memory 14 and performs the same integration process executed in the integration circuits 153-155 (Step S2-1). Then, the CPU 113 performs a decimation process of N:1 (Step S2-2). Then, the CPU 113 performs the same differential process executed in the differential circuits 157-159 and stores the obtained PCM data in the memory 114 (Step S2-3).

Then, the CPU 113 sequentially reads out i PCM data (PCM data items) and i coefficients A1-Ai from the memory 114 and performs the same multiplication process executed in the multipliers $172_1$-$172_i$ (Step S2-4). Then, the CPU 113 performs the same addition process executed in the adder 173 (Step S2-5). Then, the CPU 113 performs a decimation process of M:1 and stores the obtained PCM data in the memory 114 (Step S2-6).

Figure 7:
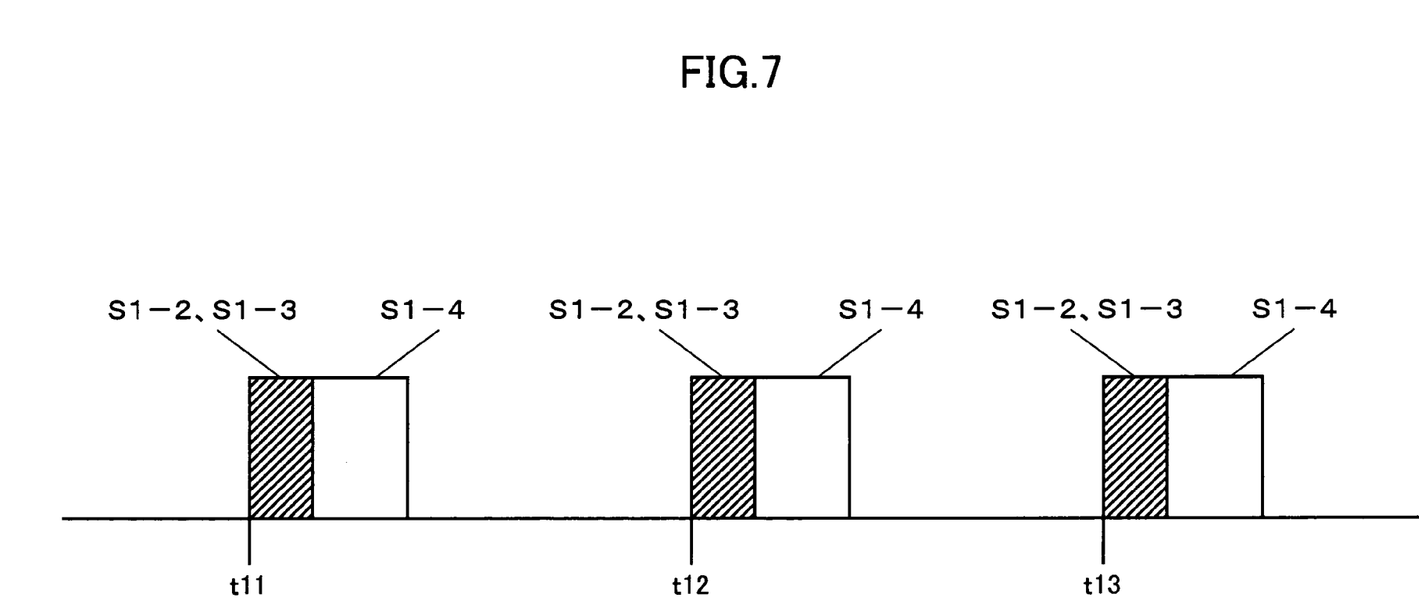
FIG. 7 is a schematic diagram for describing an operation of a digital signal processing apparatus according to an embodiment of the present invention.

FIG. 7 is a schematic diagram for describing the operation of the digital signal processing apparatus according to an embodiment of the present invention. In FIG. 7, time "t11", time "t12", and time "t13" indicate the timing of timer interruption. In a case where a timer interruption occurs at time "t11", "t12", and "t13", the CPU 113 obtains a PDM signal from the sigma-delta modulator 112 (Step S1-2) and performs a process in accordance with the digital filtering process program 141 (Step S1-3). Accordingly, analog signals obtained from the voltage detection part 121, the temperature detection part 122, and the current detection part 123 are converted to PCM data.

The CPU 113 calculates the amount remaining in the battery 102 based on the PCM data obtained in Step S1-3. The calculated remaining battery amount is stored in the memory 114. The calculated remaining battery amount stored in the memory is retrieved according to a request from an outside circuit and is transmitted to the outside circuit via the communication circuit 116.

With the digital signal processing apparatus according to an embodiment of the present invention, analog signals are converted to PCM data by modulating the analog signals to PDM signals with the sigma-delta modulator 112 and performing a digital filtering process on the PDM signals with the CPU 113. Accordingly, an A/D converter having a complicated configuration can be replaced with a sigma-delta modulator 112 having a simple configuration. Furthermore, the process of calculating the remaining battery amount can be performed with the CPU 113. This can be achieved given that the workload for the CPU 113 to perform the battery remaining amount calculation is small and that the digital filtering process can be performed efficiently.

Although the detection part 111, sigma-delta modulator 112, the CPU 113, and the memory 114 in the above-described embodiment of the present invention are mounted on the same semiconductor chip, the analog circuits of the detection part 111 and the sigma-delta modulator 112 may be mounted on one semiconductor chip while the digital circuits of the CPU 113 and the memory 114 are mounted on another separate semiconductor chip. Alternatively, the detection part 111 may be configured as a semiconductor apparatus of a single chip on which the sigma-delta modulator 112, the CPU 113, and the memory 114 are mounted. The CPU 113 and the memory 114 may be provided to an outer part of a battery pack.

Further, the present invention is not limited to these embodiments, but variations and modifications may be made without departing from the scope of the present invention.

The present application is based on Japanese Priority Application Nos. 2006-035593 and 2007-022195 filed on Feb. 13, 2006 and Jan. 31, 2007, with the Japanese Patent Office, the entire contents of which are hereby incorporated by reference.

What is claimed is:

1. A digital signal processing apparatus for converting an analog signal to a digital signal and digitally processing the digital signal, the apparatus comprising:
   a modulation part for performing pulse density modulation on the analog signal and outputting a pulse density modulation signal;
   a memory for storing a conversion program for converting the pulse density modulation signal to the pulse code modulation data;
   a CPU for receiving the pulse density modulation signal from the modulation part and converting the received pulse density modulation signal to pulse code modulation data according to the conversion program stored in the memory;
   wherein the CPU is configured to generate a timer interruption, and
   wherein the CPU is configured to obtain the pulse density modulation signal from the modulation part and convert the obtained pulse density modulation signal to the pulse code modulation data when the timer interruption is generated;
   a detection part for detecting the analog signal and supplying the analog signal to the modulation part; and
   a battery connected to the detection part,
   wherein the detection part includes
   a voltage detection part for detecting voltage of the battery,
   a current detection part for detecting charge current and discharge current of the battery,
   a temperature detection part for detecting temperature, and
   a selection part for selecting an analog signal output from one of the voltage detection part, the current detection part, and the temperature detection part and supplying the selected analog signal to the modulation part.

2. The digital signal processing apparatus as claimed in claim 1,
   wherein the analog signal indicates the charge current and discharge current of the battery,
   wherein the memory stores a remaining battery amount calculation program used for calculating the amount of charge remaining in the battery by integrating the charge current and discharge current of the battery, and
   wherein the CPU calculates the amount of charge remaining in the battery by integrating the pulse code modulation data of the charge current and discharge current of the battery according to the remaining battery amount calculation program stored in the memory.

3. The digital signal processing apparatus as claimed in claim 1, wherein the modulation part is a sigma-delta converter.

4. The digital signal processing apparatus as claimed in 1, wherein the detection part, the modulation part, the memory, and the CPU are mounted on the same semiconductor integrated circuit apparatus.

* * * * *